United States Patent
Nagase et al.

(10) Patent No.: US 10,026,891 B2
(45) Date of Patent: Jul. 17, 2018

(54) MAGNETORESISTIVE ELEMENT

(71) Applicant: TOSHIBA MEMORY CORPORATION, Minato-ku, Tokyo (JP)

(72) Inventors: Toshihiko Nagase, Tokyo (JP); Tadashi Kai, Tokyo (JP); Youngmin Eeh, Kawagoe (JP); Koji Ueda, Fukuoka (JP); Daisuke Watanabe, Kai (JP); Kazuya Sawada, Morioka (JP); Hiroaki Yoda, Kawasaki (JP)

(73) Assignee: TOSHIBA MEMORY CORPORATION, Tokyo (JP)

( * ) Notice: Subject to any disclaimer, the term of this patent is extended or adjusted under 35 U.S.C. 154(b) by 5 days.

(21) Appl. No.: 15/198,543

(22) Filed: Jun. 30, 2016

(65) Prior Publication Data

US 2016/0315251 A1 Oct. 27, 2016

Related U.S. Application Data

(63) Continuation of application No. 14/024,114, filed on Sep. 11, 2013, now abandoned.

(60) Provisional application No. 61/804,420, filed on Mar. 22, 2013.

(51) Int. Cl.
   *H01L 43/08* (2006.01)
   *H01L 43/12* (2006.01)
   *H01L 43/10* (2006.01)
   *H01L 43/02* (2006.01)

(52) U.S. Cl.
   CPC .............. *H01L 43/08* (2013.01); *H01L 43/02* (2013.01); *H01L 43/10* (2013.01); *H01L 43/12* (2013.01)

(58) Field of Classification Search
   None
   See application file for complete search history.

(56) References Cited

U.S. PATENT DOCUMENTS

| | | | | |
|---|---|---|---|---|
| 5,594,933 A | * | 1/1997 | Hayashi | ................. B82Y 25/00 257/E43.005 |
| 6,721,149 B1 | * | 4/2004 | Shi | ......................... B82Y 10/00 360/324.2 |
| 2005/0099724 A1 | | 5/2005 | Nakamura et al. | |
| 2005/0270704 A1 | | 12/2005 | Suzuki et al. | |

(Continued)

FOREIGN PATENT DOCUMENTS

| JP | 2001102657 A | 4/2001 |
|---|---|---|
| JP | 2008198792 A | 8/2008 |

(Continued)

OTHER PUBLICATIONS

International Search Report including Written Opinion dated Apr. 28, 2014, issued in International Application No. PCT/JP2014/057641.

Primary Examiner — Andres Munoz
(74) Attorney, Agent, or Firm — Holtz, Holtz & Volek PC

(57) ABSTRACT

A magnetoresistive element including a first magnetic layer; a first nonmagnetic layer provided on the first magnetic layer, the first nonmagnetic layer formed of $SrTiO_3$, $SrFeO_3$, $LaAlO_3$, $NdCoO_3$, or BN; and a second magnetic layer provided on the first nonmagnetic layer, wherein the first nonmagnetic layer is lattice-matched to the first magnetic layer, and the second magnetic layer is lattice-matched to the first nonmagnetic layer.

17 Claims, 2 Drawing Sheets

(56) References Cited

U.S. PATENT DOCUMENTS

| | | |
|---|---|---|
| 2007/0096229 A1 | 5/2007 | Yoshikawa et al. |
| 2008/0164548 A1 | 7/2008 | Ranjan et al. |
| 2009/0080124 A1 | 3/2009 | Yoshikawa et al. |
| 2009/0080238 A1 | 3/2009 | Yoshikawa et al. |
| 2009/0251951 A1 | 10/2009 | Yoshikawa et al. |
| 2010/0230770 A1* | 9/2010 | Yoshikawa ............. G11C 11/16 257/421 |
| 2012/0068139 A1 | 3/2012 | Daibou et al. |
| 2012/0069642 A1 | 3/2012 | Ueda et al. |

FOREIGN PATENT DOCUMENTS

| | | |
|---|---|---|
| JP | 2009081215 A | 4/2009 |
| JP | 2010219177 A | 9/2010 |
| JP | 2011003869 A | 1/2011 |
| JP | 2012069595 A | 4/2012 |

\* cited by examiner

MAGNETORESISTIVE ELEMENT

CROSS-REFERENCE TO RELATED APPLICATIONS

This application is a Continuation Application of U.S. Ser. No. 14/024,114, filed Sep. 11, 2013, which claims the benefit of U.S. Provisional Application No. 61/804,420, filed Mar. 22, 2013, the entire contents of both of said Applications are incorporated herein by reference.

FIELD

Embodiments described herein relate generally to a magnetoresistive element and a manufacturing method thereof.

BACKGROUND

In recent years, a semiconductor memory with a resistance change element such as a PRAM (phase-change random access memory) or an MRAM (magnetic random access memory), has been attracting attention and being developed, in which the resistance change element is utilized as a memory element. The MRAM is a device which performs a memory operation by storing "1" or "0" information in a memory cell by using a magnetoresistive effect, and has such features as nonvolatility, high-speed operation, high integration and high reliability.

A large number of MRAMs, which use elements exhibiting a tunneling magnetoresistive (TMR) effect, among other magnetoresistive effects, have been reported. One of magnetoresistive effect elements is a magnetic tunnel junction (MTJ) element including a three-layer multilayer structure of a recording layer having a variable magnetization direction, an insulation film as a tunnel barrier, and a reference layer which maintains a predetermined magnetization direction.

The resistance of the MTJ element varies depending on the magnetization directions of the recording layer and reference layer. When these magnetization directions are parallel, the resistance takes a minimum value, and when the magnetization directions are antiparallel, the resistance takes a maximum value, and information is stored by associating the parallel state and antiparallel state with binary information "0" and binary information "1", respectively.

Write of information to the MTJ element involves a magnetic-field write scheme in which only the magnetization direction in the recording layer is inverted by a current magnetic field resulting from a current flowing through a write wire and a write (spin injection write) scheme using spin angular momentum movement in which the magnetization direction in the recording layer is inverted by passing a spin polarization current through the MTJ element itself.

In the former scheme, when the element size is reduced, the coercivity of a magnetic body constituting the recording layer increases and the write current tends to increase, and thus it is difficult to achieve both the miniaturization and reduction in electric current.

On the other hand, in the latter scheme (spin injection write scheme), as the volume of the magnetic layer constituting the recording layer becomes smaller, the number of spin-polarized electrons to be injected, may be smaller, and thus it is expected that both the miniaturization and reduction in electric current can be easily achieved.

DETAILED DESCRIPTION

Figure 1:
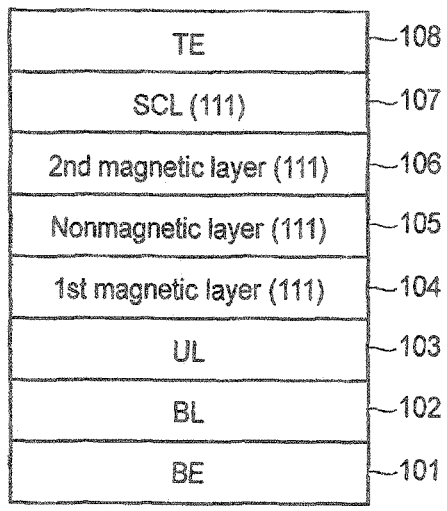
FIG. 1 is a cross-sectional view schematically illustrating a magnetoresistive element according to an embodiment.

Various embodiments will be described hereinafter with reference to the accompanying drawings. In the drawings to be described below, the parts corresponding to those in a preceding drawing are denoted by like reference numerals, and an overlapping description is omitted.

According to an embodiment, a magnetoresistive element is disclosed. The magnetoresistive element includes a first magnetic layer having a variable magnetization direction. A first nonmagnetic layer is provided on the first magnetic layer. A second magnetic layer having a fixed magnetization direction is provided on the first nonmagnetic layer. The first magnetic layer, the first nonmagnetic layer, and the second magnetic layer are preferredly oriented in a cubical crystal (111) plane or a hexagonal crystal (0002) plane.

According to another embodiment, a method for manufacturing a magnetoresistive element is disclosed. The method includes forming a first magnetic layer by depositing a magnetic material having a variable magnetization direction, forming a nonmagnetic layer on the first magnetic layer by depositing a nonmagnetic material, and forming a second magnetic layer on the nonmagnetic layer by depositing a magnetic material having a fixed magnetization direction. The first magnetic layer, the nonmagnetic layer, and the second magnetic layer are preferredly oriented in a hexagonal crystal (111) plane or a hexagonal crystal (0002) plane.

First Embodiment

FIG. 1 is a cross-sectional view schematically illustrating a magnetoresistive element according to a first embodiment, and more specifically a cross-sectional structure of an MTJ element.

In the Figure, numeral 101 denotes a bottom electrode (BE) 101 provided on a silicon substrate (semiconductor substrate) which is not illustrated, a buffer layer (BL) 102 is provided on this bottom electrode 101. An underlying layer (UL) 103 is provided on the buffer layer 102.

A first magnetic layer 104, which is used as a recording layer and is preferredly oriented in, e.g. a (111) plane of face-centered cubic structure, is provided on the underlying layer 103.

A first nonmagnetic layer 105, which is used as a tunnel barrier layer and is preferredly oriented in, e.g. a (111) plane of face-centered cubic structure, is provided on the first magnetic layer 104. The first nonmagnetic layer 105 is formed to be lattice-matched to the first magnetic layer 104.

A second magnetic layer 106, which is used as a reference layer and is preferredly oriented in, e.g. a (111) plane of face-centered cubic structure, is provided on the first nonmagnetic layer 105. The second magnetic layer 106 is formed to be lattice-matched to the first nonmagnetic layer 105.

A shift cancelling layer (SCL) 107, which is preferredly oriented in, e.g. a (111) plane, is provided on the second magnetic layer 106. The shift cancelling layer 107 is formed to be lattice-matched to the second magnetic layer 106. A top electrode (TE) 108 is provided on the shift cancelling layer 107.

In the case of the present embodiment, the first magnetic layer 104, first nonmagnetic layer 105 and second magnetic layer 106 (MTJ) are formed to be lattice-matched. When a magnetic layer, a nonmagnetic layer and a magnetic layer, which have close lattice constants, are stacked, a high MR can be expected because of continuity of band structures of the respective layers and a specific spin filtering effect at interfaces.

Here, a desirable lattice matching in an invention is described. Each layer of a (111) plane of a face-centered cubic (fcc) structure, which is a basic crystal structure, is a close-packed layer. In the face-centered cubic structure, lattice points exist at the corners of a cubic and at the centers of the respective planes. If the lattice constant is "a", the lattice points form a regular triangle of a/$\sqrt{2}$. In a hexagonal close-packed (hcp) structure, if the lattice constant of an a-axis is "a'", each layer of a (0001) plane is a close-packed layer, and lattice points form a regular triangle with one side of "a'". For example, the (111) plane of the face-centered cubic structure with the lattice constant "a" and the (0001) plane of the hexagonal close-packed structure with the lattice constant "a'" of the a-axis are lattice-matched when a/$\sqrt{2}$=na'. Here, n is an integer. In the case of considering the lattice match of identical crystal structures, it should suffice if the lattice constant is an integer multiple. Moreover, in the case of a structure including lattice points of a face-centered cubic structure, such as an NaCl structure, a diamond structure, a ZnS structure, a CaF$_2$ structure or a perovskite structure, that is, in the case of a structure in which lattice points exist at the corners of a cubic and at the centers of the respective planes, lattice points forming a regular triangle exist at least in the (111) plane, and lattices are matched. In the case of the lattice of the (0001) plane of the hexagonal close-packed structure, such as a wurtzite structure, a CdI structure, a NiAs structure or a corundum structure, that is, if lattice points forming a regular triangle exist at least in the (0001) plane, lattices are matched.

The materials of the first magnetic layer 104, first nonmagnetic layer 105 and second magnetic layer 106 are, for example, as follows.

The material of the first magnetic layer 104 is a material having a face-centered cubic (fcc) structure and including at least one of Co, Fe and Ni (however, an elemental substance of Fe is excluded). In the description below, this material is expressed as fcc-Co—Fe—Ni. The (111) plane of the first magnetic layer 104 is an atomically close-packed plane.

Examples of the material of the first nonmagnetic layer 105 are SrTiO$_3$, SrFeO$_3$, LaAlO$_3$ and NdCoO$_3$, which are of a perovskite structure, or BN which is of a ZnS structure.

The material of the second magnetic layer 106 is fcc-Co—Fe—Ni. The (111) plane of the second magnetic layer 104 is an atomically close-packed plane. The first magnetic layer 104 and second magnetic layer 106 may be formed of the same material or may be formed of different materials.

The lattice constant of the above-described fcc-Co—Fe—Ni is 3.5 to 3.65 angstroms. In addition, one side of the regular triangle of the above-described close-packed layer is 2.45 to 2.6 angstroms. SrTiO$_3$, SrFeO$_3$, LaAlO$_3$ and NdCoO$_3$ are cubic crystal systems with a perovskite structure, and their lattice constants are 3.90, 3.87, 3.79 and 3.78 angstroms, respectively. BN is of the ZnS structure, and the lattice constant thereof is 3.62 angstroms.

As regards a lattice mismatch between the first magnetic layer 104 and first nonmagnetic layer 105 and a lattice mismatch between the second magnetic layer 106 and first nonmagnetic layer 105, the materials and process conditions are properly selected and the mismatch is controlled to be reduced to, e.g. 10% or less. In the present embodiment, the (111) plane of the face-centered cubic structure of the first magnetic layer 104, first nonmagnetic layer 105 and second magnetic layer 106 is preferredly oriented.

Alternatively, as in a third embodiment which will be described later, the (0002) plane of the hexagonal close-packed structure of each of these layers may be preferredly oriented, or any one of the layers may have a face-centered cubic structure or a hexagonal close-packed structure.

In the present embodiment, the first magnetic layer 104, first nonmagnetic layer layer 105 and second magnetic layer 106 are preferredly oriented in the (111) plane of face-centered cubic structure. Thus, the shift cancelling layer 107, which is preferredly oriented in the (111) plane of face-centered cubic structure, is easily formed on the second magnetic layer 106, and as a result the thickness of the shift cancelling layer 107 can be reduced. For example, the thickness of the shift cancelling layer 107 can be set at 10 nm or less. Thereby, an MTJ element with a very small film thickness of the entire MTJ structure can be realized, and the amount of etching at a time of device-processing the MTJ film can be reduced.

Figure 2:
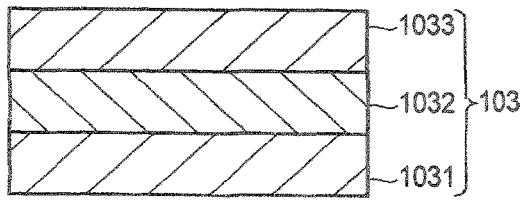
FIG. 2 is a cross-sectional view for describing an example of a structure of underlying layer of a magnetoresistive element according to an embodiment.

FIG. 2 is a cross-sectional view for describing an example of the structure of the buffer layer 102 and underlying layer 103 of the magnetoresistive element according to the embodiment.

The buffer layer 102 is formed of a Ta layer, and Ru of the underlying layer 103, which is formed on the buffer layer 102, grows with a preferred orientation of a (0002) plane of hexagonal close-packed structure. For example, in the case where the magnetic material 104 is a Co layer, the Co layer also grows with a preferred orientation of a (0002) plane of hexagonal close-packed structure, by the influence of the orientation plane of Ru. The Ta layer 102 has a structure of amorphous or microcrystal, and has a function of eliminating the influence of the crystal orientation of a layer (e.g. bottom electrode 101) which is located under the Ta layer 102. Thus, a Ru layer 1032 and Co layer 104, which are preferredly oriented in the (0002) plane of hexagonal close-packed structure, can easily be formed.

Figure 3:
FIG. 3 is a cross-sectional view for describing an example of an SAF structure of magnetoresistive element according to an embodiment.

FIG. 3 is a cross-sectional view for describing an example of an SAF (Synthetic Anti-Ferromagnet) structure of the magnetoresistive element according to the embodiment. Here, the SAF structure refers to a structure comprising two magnetic layers and a nonmagnetic layer therebetween in which the magnetic layers have magnetization directions antiparallel each other. A second nonmagnetic layer (e.g. Ru layer) 201 is provided between the second magnetic layer 106 and shift cancelling layer 107. A multilayer structure formed of the second magnetic layer 106, second nonmagnetic layer 201 and shift cancelling layer 107, constitutes the SAF structure. By using that kind of SAF structure, the magnetization fixing force of the second magnetic layer 106 and shift cancelling layer 107 is increased, and as a result the tolerance to external magnetization and the thermal stability are improved.

Figure 4:
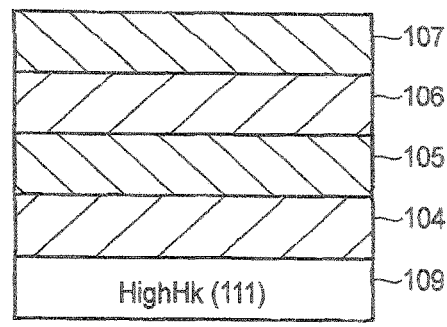
FIG. 4 is a cross-sectional view schematically illustrating a main part of magnetoresistive element including a high anisotropy magnetic field layer according to an embodiment.

As illustrated in FIG. 4, the magnetoresistive element according to the present embodiment may include a high anisotropy magnetic field layer 109 which includes a material having a large magnetic anisotropy, namely a material (high Hk material) having a large anisotropic magnetic field, and is preferredly oriented in an atomically close-packed plane such as an fcc (111) plane or an hcp (0002) plane. The first magnetic layer 104 or the like are formed on the high anisotropy magnetic field layer 109. By the provision of the high anisotropy magnetic field layer 109, an MTJ element (vertical magnetization-type MTJ element), which includes a vertical magnetization magnetic film with an axis of easy magnetization in a direction perpendicular to the film surface, can easily be realized.

FIG. 5 to FIG. 9 are cross-sectional views for describing a manufacturing method of the magnetoresistive element according to the present embodiment.

Figure 5:
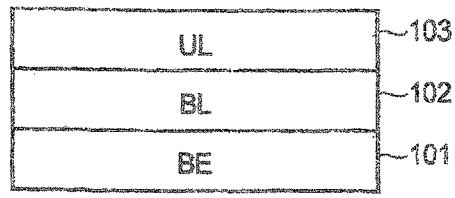
FIG. 5 is a cross-sectional view for describing a manufacturing method of a magnetoresistive element according to an embodiment.

As shown in FIG. 5, a bottom electrode 101, a buffer layer 102 and an underlying layer 103 are formed on a silicon substrate that is not shown.

Figure 6:
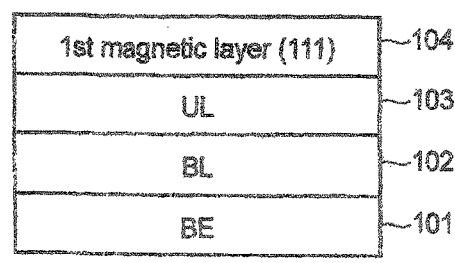
FIG. 6 is a cross-sectional view for describing the manufacturing method of the magnetoresistive element according to the embodiment following FIG. 5.

Next, as shown in FIG. 6, a first magnetic layer 104, which is preferredly oriented in a (111) plane of face-centered cubic structure, is formed on the underlying layer 103. The first magnetic layer 104 is formed by, e.g. a sputtering method. By using the sputtering method, a magnetic material with an atomically close-packed plane and a variable magnetization direction can be deposited. That is, the first magnetic layer 104, which is formed by the method of the embodiment, is not an amorphous magnetic layer, but a magnetic layer which is preferredly oriented in the (111) plane of face-centered cubic structure. Thus, the first magnetic layer 104 is not obtained by crystallizing an amorphous magnetic layer by heat treatment.

Figure 7:
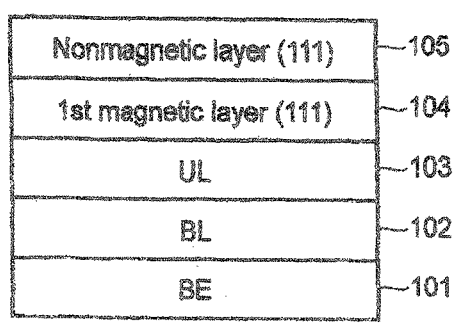
FIG. 7 is a cross-sectional view for describing a manufacturing method of the magnetoresistive element according to the embodiment following FIG. 6.

Next, as illustrated in FIG. 7, a first nonmagnetic layer 105, which is preferredly oriented in a (111) plane of face-centered cubic structure, is formed on the first magnetic layer 104. The first nonmagnetic layer 105 is formed by, e.g. a sputtering method. By using the sputtering method, a nonmagnetic material with an atomically close-packed plane can be deposited. That is, the first nonmagnetic layer 105, which is formed by the method of the embodiment, is not an amorphous nonmagnetic layer, but a nonmagnetic layer which is preferredly oriented in the (111) plane of face-centered cubic structure. Namely, the first nonmagnetic layer 105 is formed in the state in which the first nonmagnetic layer 105 takes over the crystal orientation from the first magnetic layer 104 and is preferredly oriented in the (111) plane of face-centered cubic structure. Thus, the first nonmagnetic layer 105 is not obtained by crystallizing an amorphous nonmagnetic layer by heat treatment.

Figure 8:
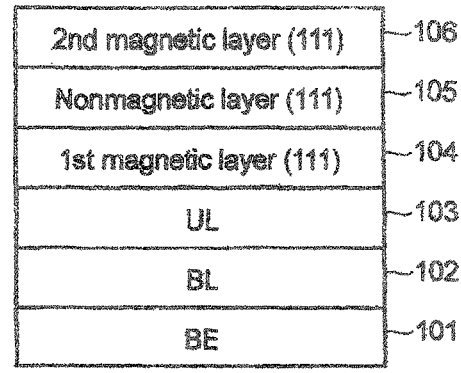
FIG. 8 is a cross-sectional view for describing a manufacturing method of the magnetoresistive element according to the embodiment following FIG. 7.

Next, as shown in FIG. 8, a second magnetic layer 106, which is preferredly oriented in a (111) plane of face-centered cubic structure, is formed on the first nonmagnetic layer 105. The second magnetic layer 106 is formed by, e.g. a sputtering method. Like the case of the first magnetic layer 104, the second magnetic layer 106, which is formed by the method of the embodiment, is not an amorphous magnetic layer, but a magnetic layer which is preferredly oriented in the (111) plane of face-centered cubic structure. That is, the second magnetic layer 106 is formed in the state in which the second magnetic layer 106 takes over the crystal orientation from the first nonmagnetic layer 105 and is preferredly oriented in the (111) plane of face-centered cubic structure. Thus, the second magnetic layer 106 is not obtained by crystallizing an amorphous magnetic layer by heat treatment.

Figure 9:
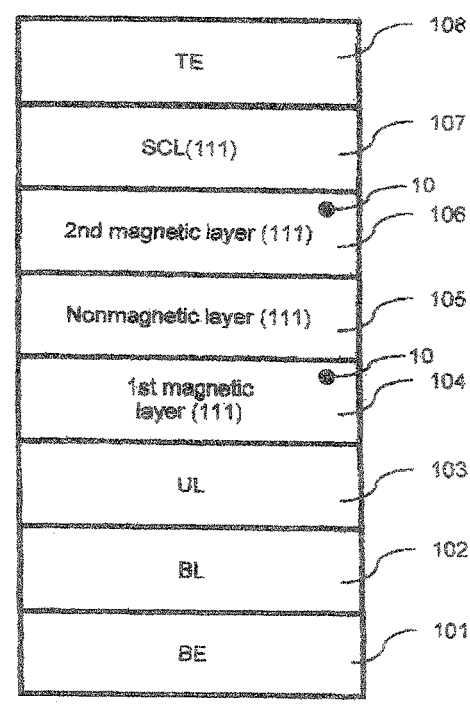
FIG. 9 is a cross-sectional view for describing a manufacturing method of the magnetoresistive element according to the embodiment following FIG. 8.

Next, as illustrated in FIG. 9, a shift cancelling layer 107, which is preferredly oriented in a (111) plane of face-centered cubic structure, is formed on the second magnetic layer 106. The shift cancelling layer 107 is formed in the state in which the shift cancelling layer 107 takes over the crystal orientation from the second magnetic layer 106 and is preferredly oriented in the (111) plane of face-centered cubic structure. Like the layers 104, 105 and 106, the shift cancelling layer 107 is formed by, e.g. a sputtering method.

Since the second magnetic layer 106, which is the underlying layer of the shift cancelling layer 107, is preferredly oriented in the (111) plane of face-centered cubic structure, the shift cancelling layer 107 is easily preferredly oriented in the (111) plane of face-centered cubic structure. Thus, there is no need to form the shift cancelling layer 107 with a large thickness in order to obtain the shift cancelling layer 107 having a (111) plane of face-centered cubic structure with a small lattice mismatch.

Thereafter, an etching mask 301 is formed on the shift cancelling layer 107, the by using the etching mask 301 as a mask, the layers 108, 107, 106, 105, 103, 102 and 101 are successively etched to obtain the magnetoresistive element shown in FIG. 1.

Second Embodiment

In the first embodiment, a magnetic material, which is preferredly oriented in a (111) plane of face-centered cubic structure, is used as the material of the first and second magnetic layers 104 and 106, and a nonmagnetic material, which is preferredly oriented in a (111) plane of face-centered cubic structure, is used as the material of the first nonmagnetic layer 105.

In the present embodiment, a magnetic material, which is preferredly oriented in a (0002) plane of hexagonal close-packed structure, is used as the material of the first and second magnetic layers 104 and 106, and a nonmagnetic material, which is preferredly oriented in a (0002) plane of hexagonal close-packed structure, is used as the material of the first nonmagnetic layer 105.

In the following, the first magnetic layer 104, first nonmagnetic layer 105 and second magnetic layer 106 are preferredly oriented in the (0002) plane of hexagonal close-packed structure in the description below, alternatively a mixture of the (111) plane of face-centered cubic structure and (0002) plane of hexagonal close-packed structure may be exist in those films as the preferred orientation plane. For example, the first magnetic layer 104 may have the (111) plane of face-centered cubic structure, the first nonmagnetic layer may have the (0002) plane of hexagonal close-packed structure, and the second magnetic layer may have the (111) plane of face-centered cubic structure.

The material of the first and second magnetic layers 104 and 106 is a material having a hexagonal close-packed (hcp) and including at least one of Co, Fe and Ni (however, an elemental substance of Fe is excluded). In the description below, this material is expressed as hcp-Co—Fe—Ni.

The (0002) plane of hexagonal close-packed structure of the first magnetic layer 104 is an atomically close-packed plane. The lattice constant of the a-axis of the hcp-Co—Fe—Ni is 2.5 to 2.6 angstroms.

Moreover, one side of the regular triangle of the above-described close-packed layer is 2.5 to 2.6 angstroms.

The material of the first nonmagnetic layer 105 is an alloy of B and N, or an alloy of Al and O, for example, BN, BeO, or $Al_2O_3$. BN and BeO are of a wurtzite structure, and the lattice constants of the a-axis thereof are 2.5 angstroms and 2.7 angstroms, respectively. $Al_2O_3$ is of a corundum structure, and the lattice constant of the a-axis thereof is 2.5 Å.

As regards a lattice mismatch between the first magnetic layer 104 and first nonmagnetic layer 105 and a lattice mismatch between the second magnetic layer 106 and first nonmagnetic layer 105, the materials and process conditions are properly selected and the mismatch is controlled to be reduced to, e.g. 10% or less.

Third Embodiment

In the present embodiment, highly polarized magnetic materials are used as the materials of the first and second magnetic layers 104 and 106, thereby realizing a high TMR ratio.

In addition, from the standpoint of a high TMR ratio, it is not always necessary that the first magnetic layer 104, first nonmagnetic layer 105 and second magnetic layer 106 are latticed-matched. However, from the standpoint of crystal growth, it is desirable that these layers be lattice-matched. A half-metal, which is preferredly oriented in a (111) plane, is used as the highly polarized magnetic material 10.

In the present embodiment, a Heusler alloy is used as the half-metal. The Heusler alloy is represented by $X_2YZ$. The crystal structures are a $L2_1$ structure and a B2 structure which are regularized, and these are cubic crystal systems. X, Y and Z represent different elements. Examples of the Heusler alloy are $Co_2MsSi$, $Co_2FeSi$, $Co_2FeAl$, $Co_2(FeCr)$ Al, $Co_2MnGa$, $Co_2MnGe$, and $Fe_2CrSi$.

The material of the first nonmagnetic layer 105 is an insulation material or a semiconductor material, which is preferredly oriented in a (111) plane or a (0002) plane. Examples of the structure including a face-centered cubic structure are SrO (5.16 angstroms) of a NaCl structure, BaO (5.52 angstroms), $CaF_2$ (5.46 angstroms) of a $CaF_2$ structure, $SrF_2$ (5.80 angstroms), $CeO_2$ (5.41 angstroms). Examples of a structure derived from a hexagonal close-packed structure are ZnO (3.25 angstroms @ a-axis) of the wurtzite structure, and ZnS (3.82 angstroms @ a-axis).

The lattice constant of $Co_2YZ$, which is an $X_2YZ$-type Heusler alloy, is about 5.6 to 5.8 angstroms in the case of, for example, the above-described material systems. In the case of the material of the cubic crystal system, materials having similar lattice constants of 5.6 to 5.8 angstroms are preferable. In the case of the material of the hexagonal crystal system, materials having lattice constants of the a-axis of 3.9 to 4.1 angstroms are preferable. As will be described later, when it is assumed that the lattice mismatch is higher than 10%, materials having lattice constants of about ±10% from the range of the above-described lattice constants may be used.

As regards a lattice mismatch between the first magnetic layer 104 and first nonmagnetic layer 105 and a lattice mismatch between the second magnetic layer 106 and first nonmagnetic layer 105, the materials and process conditions are properly selected and the mismatch is controlled to be reduced to, e.g. 10% or less. The Heusler alloy, which is used as the first and second magnetic layers 104 and 106, is formed by using, for example, a sputtering method or an evaporation deposition method. As the manufacturing method of the magnetoresistive element of the present embodiment, the method of the first embodiment is applicable.

In addition, the magnetoresistive element of the present embodiment can adopt the structures illustrated in FIG. 2 to FIG. 4. However, the crystal plane is changed from (111) to (0002).

Each of the above-described MTJ structures can be introduced as MTJ elements of memory cells. Memory cells, memory cell arrays and memory devices are disclosed in U.S. Pat. No. 8,513,751 to Asao, the entire contents of which are incorporated by reference herein.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A magnetoresistive element having a plurality of layers including a top layer and a bottom layer, said magnetoresistive element comprising:
   a shift cancelling layer as said top layer;
   a second magnetic layer;
   a first nonmagnetic layer provided between a first magnetic layer and the second magnetic layer, the first nonmagnetic layer formed of a material selected from the group consisting of $SrTiO_3$, $SrFeO_3$, $LaAlO_3$, $NdCoO_3$ and BN;
   an underlying layer; and
   a buffer layer as said bottom layer, wherein the underlying layer is provided on the buffer layer;
   wherein from top to bottom, said plurality of layers are stacked in the following order: the shift cancelling layer, the second magnetic layer, the first nonmagnetic layer, the first magnetic layer, the underlying layer and the buffer layer,
   wherein the first nonmagnetic layer is lattice-matched to the first magnetic layer, and the second magnetic layer is lattice-matched to the first nonmagnetic layer, and
   wherein the first magnetic layer, the first nonmagnetic layer, the second magnetic layer, and the shift cancelling layer are oriented to a cubical crystal (111) plane or a hexagonal crystal (0002) plane.

2. The magnetoresistive element according to claim 1, wherein each of the first magnetic layer and the second magnetic layer is formed of a material selected from the group consisting of a monometal of Co, a monometal of Ni, an alloy of Co and Fe, an alloy of Co and Ni, an alloy of Fe and Ni, and an alloy of Co, Fe and Ni, and wherein each of the layers first magnetic layer and the second magnetic layer are oriented to an cubical crystal (111) plane.

3. The magnetoresistive element according to claim 1, wherein the first magnetic layer, the first nonmagnetic layer and the second magnetic layer are oriented to the cubical crystal (111) plane.

4. The magnetoresistive element according to claim 1, wherein BN has a ZnS structure.

5. The magnetoresistive element according to claim 1, wherein the buffer layer includes Ta.

6. The magnetoresistive element according to claim 1, further comprising a second nonmagnetic layer which is provided on the second magnetic layer.

7. The magnetoresistive element according to claim 6, wherein the second nonmagnetic layer is a Ru layer.

8. The magnetoresistive element according to claim 7, wherein the shift cancelling layer has a thickness of 10 nm or less.

9. The magnetoresistive element according to claim 1, wherein the first magnetic layer has a variable magnetization direction, and the second magnetic layer has a fixed magnetization direction.

10. The magnetoresistive element according to claim 1, wherein the first magnetic layer is a recording layer and is oriented to a (111) plane of a face-centered cubic structure.

11. The magnetoresistive element according to claim 1, wherein the first nonmagnetic layer is a tunnel barrier layer and is oriented to a (111) plane of a face-centered cubic structure.

12. The magnetoresistive element according to claim 1, wherein the second magnetic layer is a reference layer and is oriented to a (111) plane of a face-centered cubic structure.

13. The magnetoresistive element according to claim 1, wherein the shift cancelling layer is lattice-matched to the second magnetic layer.

14. The magnetoresistive element according to claim 1, wherein the first magnetic layer is oriented to the hexagonal crystal (0002) plane.

15. The magnetoresistive element according to claim 1, wherein the first nonmagnetic layer is oriented to the hexagonal crystal (0002) plane.

16. The magnetoresistive element according to claim 1, wherein the second magnetic layer is oriented to the hexagonal crystal (0002) plane.

17. The magnetoresistive element according to claim 1, wherein the shift cancelling layer is oriented to the hexagonal crystal (0002) plane.

* * * * *